United States Patent
Chang et al.

(10) Patent No.: US 9,484,970 B2
(45) Date of Patent: *Nov. 1, 2016

(54) ANALOG-TO-DIGITAL CONVERSION WITH NOISE INJECTION VIA WAVEFRONT MULTIPLEXING TECHNIQUES

(71) Applicant: SPATIAL DIGITAL SYSTEMS, INC., Camarillo, CA (US)

(72) Inventors: Donald C. D. Chang, Thousand Oaks, CA (US); Tzer-Hso Lin, Chatsworth, CA (US); Yuanchang Liu, Canoga Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,809

(22) Filed: Jan. 6, 2016

(65) Prior Publication Data

US 2016/0118995 A1    Apr. 28, 2016

Related U.S. Application Data

(63) Continuation of application No. 14/637,405, filed on Mar. 4, 2015, now Pat. No. 9,246,508, which is a continuation of application No. 13/762,413, filed on Feb. 8, 2013, now Pat. No. 8,981,976, which is a continuation of application No. 12/985,044, filed on Jan. 5, 2011, now Pat. No. 8,384,572.

(60) Provisional application No. 61/381,381, filed on Sep. 9, 2010.

(51) Int. Cl.
| | |
|---|---|
| *H03M 1/12* | (2006.01) |
| *H04B 1/12* | (2006.01) |
| *H03M 1/06* | (2006.01) |
| *H04B 1/04* | (2006.01) |

(Continued)

(52) U.S. Cl.
CPC ............. *H04B 1/123* (2013.01); *H03M 1/002* (2013.01); *H03M 1/0641* (2013.01); *H03M 1/08* (2013.01); *H03M 1/12* (2013.01); *H03M 1/1205* (2013.01); *H03M 1/188* (2013.01); *H03M 1/20* (2013.01); *H04B 1/0475* (2013.01); *H04B 7/10* (2013.01); *H04L 27/06* (2013.01); *H03M 1/1215* (2013.01)

(58) Field of Classification Search
CPC ...... H03M 1/08; H03M 1/188; H03M 1/002; H03M 1/1205; H03M 1/20
USPC .................. 341/118, 155, 131, 144
See application file for complete search history.

(56) References Cited

U.S. PATENT DOCUMENTS

| | | |
|---|---|---|
| 5,010,346 A | 4/1991 | Hamilton et al. |
| 5,077,562 A | 12/1991 | Chang et al. |

(Continued)

FOREIGN PATENT DOCUMENTS

FR    1303002    4/2003

OTHER PUBLICATIONS

R.G. Vaughan, J.B. Anderson; "Antenna Diversity in Mobile Communications;" IEEE Transactions on Vehicular Technology; Nov. 1987; pp. 149-172.

(Continued)

*Primary Examiner* — Jean B Jeanglaude

(57) ABSTRACT

A novel noise injection technique is presented to improve dynamic range with low resolution and low speed analog to digital converters. This technique combines incoming signal and noise signal with wave front de-multiplexer and split into several channels. Then low resolution and low speed analog to digital converters are used to sample each channels. All signals are recovered using wave front multiplexer. For advanced design, ground diagnostic signals with optimizing processor can be added to guarantee recovery quality.

20 Claims, 2 Drawing Sheets

(51) Int. Cl.
*H04B 7/10* (2006.01)
*H03M 1/00* (2006.01)
*H03M 1/08* (2006.01)
*H03M 1/18* (2006.01)
*H03M 1/20* (2006.01)
*H04L 27/06* (2006.01)

(56) References Cited

U.S. PATENT DOCUMENTS

| | | |
|---|---|---|
| 5,630,221 A | 5/1997 | Birleson |
| 5,969,654 A | 10/1999 | Goldin |
| 6,049,251 A | 4/2000 | Meyer |
| 6,526,139 B1 | 2/2003 | Rousell et al. |
| 6,552,832 B1 | 4/2003 | Beierle et al. |
| 6,754,610 B2 * | 6/2004 | Dudler ............... H03M 1/645 702/151 |
| 6,809,674 B1 * | 10/2004 | Ramsden ............ H03M 1/1225 341/141 |
| 7,155,193 B2 | 12/2006 | Rowe et al. |
| 7,239,260 B2 | 7/2007 | Min et al. |
| 7,321,399 B2 | 1/2008 | Rumreich |
| 7,372,386 B1 | 5/2008 | Manganaro et al. |
| 7,474,235 B2 | 1/2009 | Hsieh et al. |
| 8,294,605 B1 | 10/2012 | Pagnanelli |
| 2005/0190088 A1 | 9/2005 | Fey et al. |
| 2006/0227029 A1 | 10/2006 | Min et al. |
| 2007/0176814 A1 | 8/2007 | Grace |
| 2007/0279274 A1 | 12/2007 | Hsieh et al. |
| 2009/0058702 A1 | 3/2009 | Sugihara et al. |
| 2009/0115651 A1 | 5/2009 | Hoang et al. |
| 2009/0131010 A1 | 5/2009 | Oshima et al. |
| 2009/0174822 A1 | 7/2009 | Pugel |
| 2010/0026536 A1 | 2/2010 | Yoshioka |

OTHER PUBLICATIONS

R.G. Vaughan; "Polarization Diversity in Mobile Communications;" IEEE Transactions on Vehicular Technology; Aug. 1990; pp. 177-186.

K. Aydin, T.A. Seliga; "Remote Sensing of Hail with a Dual Linear Polarization Radar;" Journal of Climate and Applied Meteorology; Oct. 1986; V. 25; pp. 1475-1484.

* cited by examiner

ANALOG-TO-DIGITAL CONVERSION WITH NOISE INJECTION VIA WAVEFRONT MULTIPLEXING TECHNIQUES

RELATED APPLICATION DATA

This application is a continuation of application Ser. No. 14/637,405, filed Mar. 4, 2015, now pending, which is a continuation of application Ser. No. 13/762,413, filed Feb. 8, 2013, now U.S. Pat. No. 8,981,976, which is a continuation of application Ser. No. 12/985,044, filed Jan. 5, 2011, now U.S. Pat. No. 8,384,572, which claims the benefit of U.S. provisional application Ser. No. 61/381,381, filed Sep. 10, 2010.

BACKGROUND

1. Field

The present invention relates to architectures and designs of digital systems. More specifically, but without limitation thereto, the present invention pertains to an electronic signal conversion system that utilizes a noise injection system in order to maintain or increase signal resolution and increase the dynamic range. The present invention also offers a more time-efficient conversion as well as a more cost-effective conversion method.

2. Prior Art

The following is a tabulation of some prior art that presently appears relevant:

U.S. Patents

| Pat. No. | Kind Code | Issue Date | Patentee |
|---|---|---|---|
| 5,077,562 | | 1991 Dec. 31 | Chang et al. |
| 5,630,221 | | 1997 May 13 | Birleson |
| 6,049,251 | | 2000 Apr. 11 | Meyer |
| 6,526,139 | B1 | 2003 Feb. 25 | Rousell et |

Non-Patent Literature Documents

Estrada, A.; *Autotestcon*, 2007 *IEEE*, "Improving high speed analog to digital converter dynamic range by noise injection".

Currently in the electronics field, conversions between digital and analog signals are necessary for many day-to-day electronic operations. Analog signals are signals that utilize properties of the medium to convey the signal's information, essentially used in its original form. In particular for the field of electronics, an analog signal is taking a signal and translating it directly into electronic pulses. On the other hand, a signal is considered digital when it is processed into discrete time signals, usually in the form of a binary code (Is and Os instead of a continuously variable function as found in analog signals). Nowadays, although nearly all information is encrypted digitally, analog signals commonly function as carrier signals for information transmission.

As a result, conversions between analog and digital signals for modern electronics are a common occurrence. For example, portable cellular phone signals are broadcast in the analog format and need to be converted to a digital signal within the phone itself for practical use.

Television signals are also transmitted in the analog spectrum and have to be converted to digital format for signal processing.

A key performance index of conversion from analog to digital (A/D) is the dynamic range, which is the ratio between the smallest and largest possible values of changeable quantities. Additionally, only signal strengths within the specified dynamic range can be detected. As a result, the dynamic range that is factored into A/D circuit design is required to be reasonably wide, and in some cases, to be as wide as possible. For instance, color perceptible to the human eye ranges from $4.28 \times 10^{14}$ Hz (hertz) to $7.14 \times 10^{14}$ Hz. If, for example, a TV's dynamic range cannot cover this spectrum, the quality of the TV signal will degrade as it cannot show all the colors in the received TV video signal.

Utilizing such wide dynamic ranges has several issues. While higher dynamic range means better precision and resolution of digital signals, the higher dynamic range also necessitates more expensive and precise equipment. There are cases where it is impossible to implement such devices either because it is impractical or too costly, such as in mobile devices.

Additionally, analog-to-digital conversions have an issue with unwanted noise being introduced into the signal. One source of noise is the conversion itself, as an analog signal is changed to a format that eliminates some of the fine resolution of the signal. Because of this, research has been performed to increase the dynamic range of analog-to-digital converters without changing the resolution, as well as reducing unwarranted and unwanted noise. The present embodiment of the invention aims to mitigate both of these factors in A/D converters by introducing a "noise" injection to essentially cancel out any unwanted noise as well as maintain a high dynamic range so that resolution is not lost in the conversion.

SUMMARY OF THE INVENTION

The present invention is a noise injection system for the purpose of eliminating unwanted noise while maintaining a high dynamic range for analog to digital conversions, comprising: a wave front de-multiplexer, multiple analog-to-digital converters and a wave front multiplexer.

The noise injection system performs as follows. Multiple input signal streams, noise injection streams, and a ground are all connected to a wave-front multiplexer, where the signal and noise signal outputs are connected to a multiplexer. Here, the signals are multiplexed (combined) into N data streams, each with a signal component of all inputs. The multiplexer output lines are transmitted to A/D converters. After conversion to digital format, the sampled digitized signals are transmitted to a wave-front de-multiplexer, where the data streams are recovered into output signals matching the inputs. These signals are then reconverted from digital to analog if necessary.

Through injecting noises which could be eliminated by filters afterwards, the present invention enhances signal strength while maintaining a high dynamic range. Weak signals out of the A/D converter dynamic range are now able to be detected because of added noise. In such a way, the signals' dynamic range is increased. Additionally, injecting noise also has the benefit of cancelling out any unwanted noise, thus increasing clarity and signal resolution.

An alternative embodiment of the present invention involves utilizing an optimization processor that is connected to the wave-front de-multiplexer. Samples of the signals being processed are sent to the processor, where an optimization loop adaptively adjusts the strength, phase, and wave front vectors of the noise in order to cancel out the unwanted noise. After processing, the signals are re-introduced into the signal streams for proper cancellation of unwanted noise.

With the proposed noise injection system, the dynamic range of the analog-to-digital conversion system can be accommodated with the injected noise level without redesigning the system. Furthermore, the signal converters in this invention process fewer bits of data, thus reducing power requirements, cost and complexity.

| | | | |
|---|---|---|---|
| 102a | Incoming signal (analog) | 102b | Incoming signal (digital) |
| 104a | Noise to inject (analog) | 104b | Injected noise (digital) |
| 105a | Ground, no signal (analog) | 105b | Ground, no signal (digital) |
| 106a | Ground, zero (analog) | 106b | Ground, zero (digital) |
| 108 | Wave front multiplexer | 110a, b, c, d | Analog to digital converter |
| 112 | Wave front de-multiplexer | 114 | Optimizer |

DETAILED DESCRIPTION OF THE PREFERRED EMBODIMENT

The present invention relates to the architecture and design of electronic systems, and, in particular to electronic signal conversion hardware architecture and design.

Figure 1:
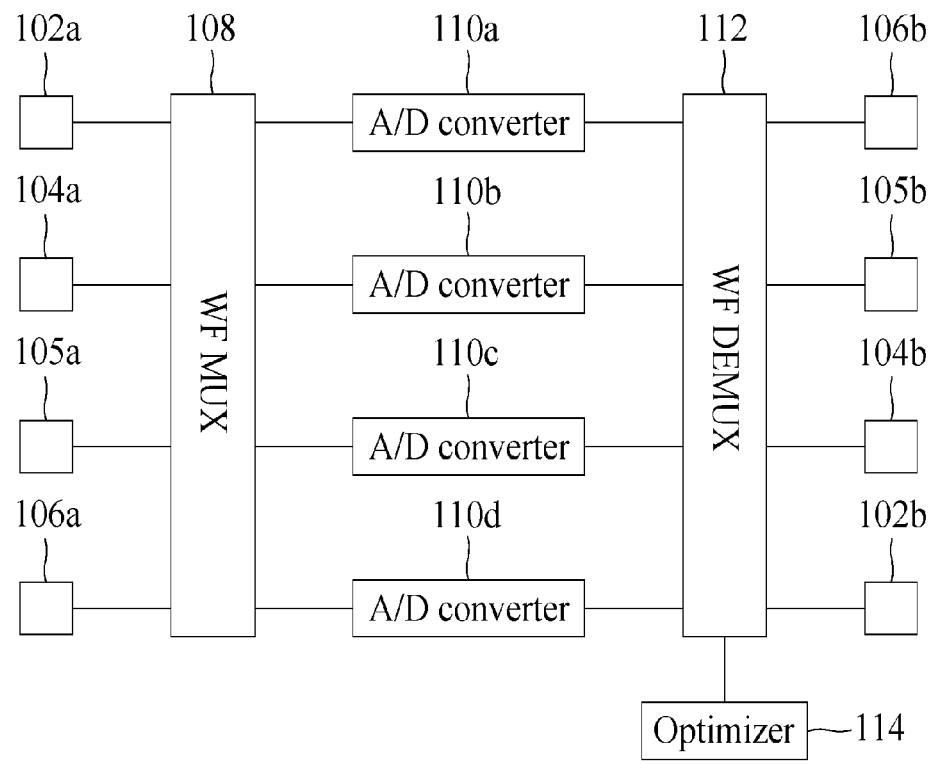
FIG. 1 is an illustration of an analog/digital conversion system with an attached optimizer

An implementation of one embodiment is shown in FIG. 1. In this particular embodiment, there are 4 input ports with 4 signal inputs including: incoming signal 102a, injected noise signal input 104a, and two grounded signals 105a, 106a, are connected to multiplexer 108. The input ports in the actual implementation may vary, and not limited to 4 input ports. The injected noise signal 104a and incoming signal 102a will be split in wave-front multiplexer 108 and mixed with each other in order to improve dynamic range of the whole system. Ground 105a and 106a will be used as diagnostic signals.

Wave-front multiplexer 108, equally splits and mixes M input signals to form N output signals, where, in this embodiment, M and N are both 4. Each of mixed N signals contains information from all M input signals. Each output of N signals maintains a fixed relative phase difference and N output signals form a wave front vector. For example, in case of FIG. 1, if I use a 4-point Fast Fourier Transformer (FFT) as a wave front multiplexer, then the phase difference between each output signal is $e^{-i\pi/2}$. The wave front vector is $[1, e^{-i\pi/2}, e^{-i\pi}, e^{-i3\pi/2}]$ This wave front vector will be used to recover the mixed signals.

Thus, after wave front multiplexer 108 processes the N inputs, 4 output signals are already incoming signals mixed with proper noises. If FFT is used as a wave front multiplexer, each channel only possesses A/D bandwidth of the original signal. As a result, cheap, low speed and low resolution A/D converters 110a, 110b, 110c and 110d are used to sample these signals. After conversion, the signals are all in the digital format.

A wave front de-multiplexer 112 performs the inverse process of wave front multiplexer. The de-multiplexer 112 is used to recover the mixed signals to the original input signals in the digital domain. For example, if FFT is used previously, an Inverse Fast Fourier Transformer (IFFT) will be used here. After this, an incoming signal in digital domain 102b, an injected noise in digital domain 104b, ground in digital domain 105b and 106b are recovered.

All signals are recovered due to the wave front vector which represents phase differences among signals. Therefore, if any distortion occurred in previous steps, the wave front vector will be distorted. However, with the help of optimizer 114, even if signals are distorted, recovery can still be successful. By using diagnostic signals ground 105a and 106a, if signal recovery is successful, the recovered signals 105b and 106b should be perfectly zero. Optimizer 114 adaptively adjusts the wave front vector until the signals 105b and 106b reach zero. Thus, any previous distortion is compensated for, and the output signals exhibit improved clarity than without the present invention.

Alternative Embodiments

Figure 2:
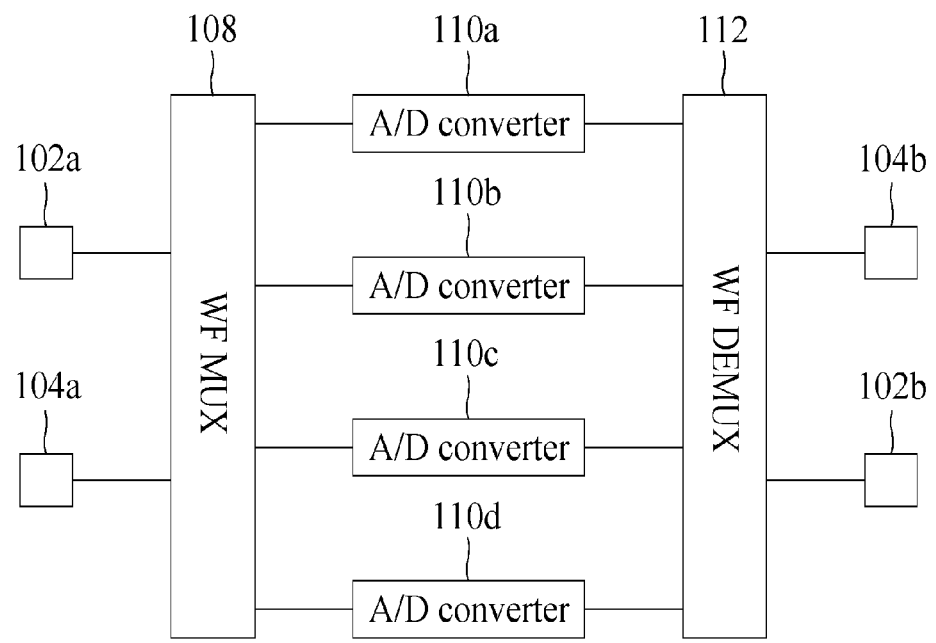
FIG. 2 is an illustration of an alternative implementation analog/digital conversion system

An alternative embodiment of the noise injection system is shown in FIG. 2. Incoming signal 102a and injected noise 104a input signals in this embodiment. The rest of this embodiment is the same as the main embodiment. But optimizer, since there is no reference signal such as 105a or 106b, quality of the output signal cannot be determined.

Figure 3:
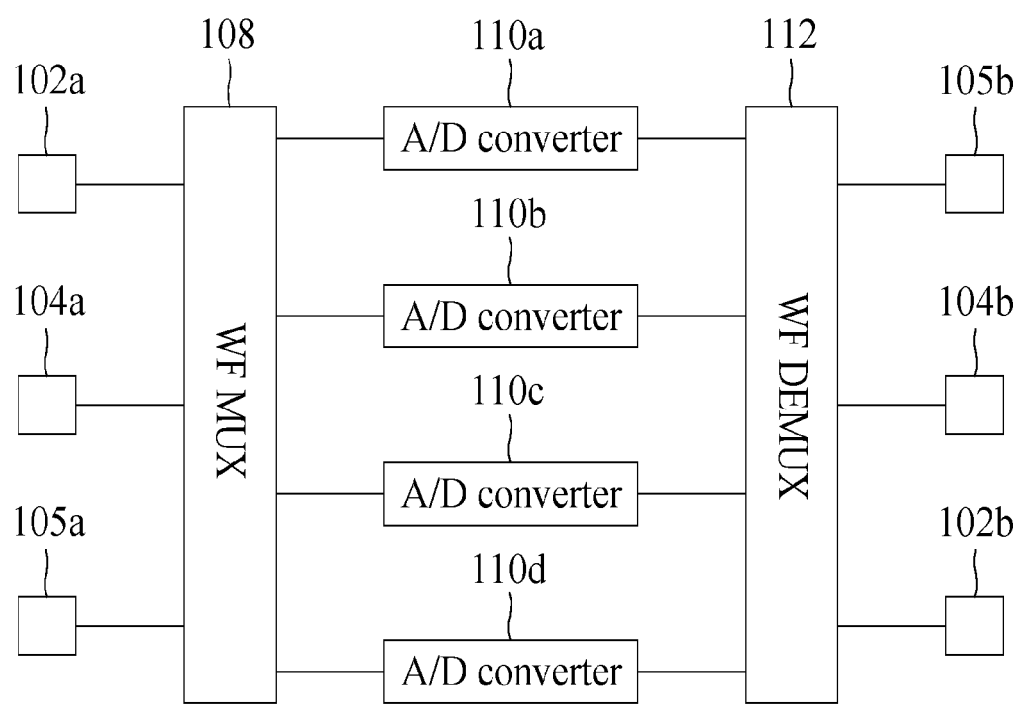
FIG. 3 is an illustration of another alternative implementation of the conversion system DRAWINGS - Reference Numerals

Another alternative embodiment of the noise injection system is shown in FIG. 3. The input signals include signal 102a, injected noise 104a and one grounded signal 105a or 106a. The rest of this embodiment is the same as main embodiment but optimizer. Signal 105b can be used as a diagnostic signal. It is to indicate the quality of the output signal 102b.

What is claims is:

1. An apparatus for processing signals, comprising:
    a first processor configured to receive a first signal and a second signal and generate a third signal containing information from said first and second signals;
    a second processor configured to apply a vector comprising a phase component to recover information associated with said third signal into a first output associated with said first signal and a second output associated with said second signal; and
    an optimizer configured to adjust said vector.

2. The apparatus of claim 1, wherein said optimizer is configured to adjust said vector for recovering said information associated with said third signal into said first output associated with said first signal and said second output of substantial zero.

3. The apparatus of claim 1, wherein said optimizer is configured to adjust said vector for recovering said information associated with said third signal into said first output of substantial zero and said second output of substantial zero.

4. The apparatus of claim 1, wherein said second signal comprises a ground signal.

5. The apparatus of claim 1 further comprising an analog-to-digital converting block configured to sample said third signal to be in a digital format, wherein said second processor is configured to apply said vector to recover information associated with said third signal in a digital format into said first and second outputs.

6. The apparatus of claim 1, wherein said first processor is configured to generate a fourth signal containing information from said first and second signals, wherein said second processor is configured to apply said vector to recover information associated with said third and fourth signals into said first and second outputs.

7. The apparatus of claim 1, wherein said first processor is configured to receive a fourth signal and generate said third signal containing information further from said fourth signal.

8. The apparatus of claim 1, wherein said first processor comprises a Fourier transformer and said second processor comprises an inverse Fourier transformer.

9. A method for processing signals in an apparatus, comprising:
 receiving, by said apparatus, a first signal;
 receiving, by said apparatus, a second signal;
 generating, by said apparatus, a third signal containing information from said first and second signals;
 applying, by said apparatus, a vector comprising a phase component to recover information associated with said third signal into a first output associate with said first signal and a second output associate with said second signal; and
 adjusting said vector.

10. The method of claim 9 further comprising said adjusting said vector for recovering said information associated with said third signal into said first output associate with said first signal and said second output of substantial zero.

11. The method of claim 9 further comprising said adjusting said vector for recovering said information associated with said third signal into said first output of substantial zero and said second output of substantial zero.

12. The method of claim 9, wherein said second signal comprises a ground signal.

13. The method of claim 9 further comprising sampling, by said apparatus, said third signal to be in a digital format, followed by said applying said vector to recover information associated with said third signal in a digital format into said first and second outputs.

14. The method of claim 9 further comprising generating, by said apparatus, a fourth signal containing information from said first and second signals, followed by applying said vector to recover information associated with said third and fourth signals into said first and second outputs.

15. The method of claim 9 further comprising receiving, by said apparatus, a fourth signal, followed by said generating said third signal containing information further from said fourth signal.

16. The method of claim 9 further comprising said generating, by a Fourier transformer of said apparatus, said third signal containing information from said first and second signals.

17. A method for processing signals in an apparatus, comprising:
 receiving, by said apparatus, a first signal in an analog format;
 receiving, by said apparatus, a second signal in an analog format;
 generating, by said apparatus, a third signal containing information from said first and second signals;
 generating, by said apparatus, a fourth signal containing information from said first and second signals;
 sampling, by said apparatus, said third and fourth signals to be in a digital format; and
 recovering, by said apparatus, information associated with said third and fourth signals in a digital format into a first output associated with said first signal in a digital format and a second output associated with said second signal in a digital format.

18. The method of claim 17, wherein said second signal comprises a ground signal.

19. The method of claim 17 further comprising adjusting, by said apparatus, a vector applied for said recovering said information associated with said third and fourth signals in a digital format into said first and second outputs.

20. The method of claim 17 further comprising said recovering said information associated with said third and fourth signals in a digital format into said first output and said second output of substantial zero.

* * * * *